United States Patent
Kim et al.

(10) Patent No.: US 9,559,251 B2
(45) Date of Patent: *Jan. 31, 2017

(54) LIGHT EMITTING DEVICE HAVING TRANSPARENT ELECTRODE AND METHOD OF MANUFACTURING LIGHT EMITTING DEVICE

(75) Inventors: Tae Geun Kim, Gyeonggi-do (KR); Hee-Dong Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/413,911

(22) PCT Filed: Sep. 10, 2012

(86) PCT No.: PCT/KR2012/007256
§ 371 (c)(1),
(2), (4) Date: Feb. 19, 2015

(87) PCT Pub. No.: WO2014/010779
PCT Pub. Date: Jan. 16, 2014

(65) Prior Publication Data
US 2015/0171262 A1    Jun. 18, 2015

(30) Foreign Application Priority Data
Jul. 11, 2012 (KR) .................. 10-2012-0075651

(51) Int. Cl.
*H01L 33/60* (2010.01)
*H01L 33/00* (2010.01)
(Continued)

(52) U.S. Cl.
CPC ....... *H01L 33/0025* (2013.01); *H01L 33/0075* (2013.01); *H01L 33/0079* (2013.01);
(Continued)

(58) Field of Classification Search
CPC .......... H01L 33/60; H01L 33/20; H01L 33/62; H01L 33/54; H01L 33/58
(Continued)

(56) References Cited

U.S. PATENT DOCUMENTS 8,796,707 B2 * 8/2014 Kang .................. H01L 21/0237
257/98
8,809,895 B2 * 8/2014 Choi ....................... H01L 33/14
257/99
(Continued)

FOREIGN PATENT DOCUMENTS

| JP | 2005-94020 | 4/2005 |
|----|------------|--------|
| JP | 2005-158955 | 6/2005 |

(Continued)

OTHER PUBLICATIONS

International Search Report for International Application No. PCT/KR2012/007256, dated Mar. 6, 2013.

*Primary Examiner* — Quoc Hoang
(74) *Attorney, Agent, or Firm* — Kile Park Reed & Houtteman PLLC

(57) ABSTRACT

Provided are a light emitting device including a transparent electrode having high transmittance with respect to light in a UV wavelength range as well as in a visible wavelength range and good ohmic contact characteristic with respect to a semiconductor layer and a method of manufacturing the light emitting device. A transparent electrode of a light emitting device is formed by using a resistance change material which has high transmittance with respect to light in a UV wavelength range and of which resistance state is to be changed from a high resistance state into a low resistance state due to conducting filaments, which current can flow through, formed in the material if a voltage exceeding a threshold voltage inherent in a material applied to the (Continued)

material, so that it is possible to obtain high transmittance with respect to light in a UV wavelength range.

12 Claims, 13 Drawing Sheets

(51) Int. Cl.
*H01L 33/32* (2010.01)
*H01L 33/42* (2010.01)
*H01L 33/06* (2010.01)
*H01L 33/14* (2010.01)
*H01L 33/40* (2010.01)

(52) U.S. Cl.
CPC .............. *H01L 33/06* (2013.01); *H01L 33/14* (2013.01); *H01L 33/32* (2013.01); *H01L 33/405* (2013.01); *H01L 33/42* (2013.01); *H01L 2933/0016* (2013.01)

(58) Field of Classification Search
USPC ...................................................... 257/98, 99
See application file for complete search history.

(56) References Cited

U.S. PATENT DOCUMENTS

2013/0207149 A1\* 8/2013 Kim .................. H01L 33/22
257/98
2016/0005925 A1\* 1/2016 Kim .................. H01L 33/14
257/76

FOREIGN PATENT DOCUMENTS

| JP | 2005-317676 | 11/2005 |
|---|---|---|
| KR | 10-0646636 | 11/2006 |
| KR | 10-2009-0032366 | 4/2009 |
| KR | 10-2010-0054074 | 5/2010 |
| KR | 10-2011-0121338 | 11/2011 |
| KR | 10-2012-0044545 | 5/2012 |

\* cited by examiner

LIGHT EMITTING DEVICE HAVING TRANSPARENT ELECTRODE AND METHOD OF MANUFACTURING LIGHT EMITTING DEVICE

BACKGROUND OF THE INVENTION

1. Field of the Invention

The present invention relates to a light emitting device including a transparent electrode and a method of manufacturing the light emitting device, and more particularly, to a light emitting device including a transparent electrode having good ohmic contact characteristic and high transmittance and a method of manufacturing the light emitting device.

2. Description of the Related Art

Transparent electrodes have been used in various application fields such as LEDs, solar cells, medical UV sterilizers, and fisheries, and the application fields and their demands have been gradually increased. Particularly, the transparent electrodes have been actively used in the LED field. The transparent electrode technique currently applied to the LEDs is mainly an ITO (indium tin oxide) based technique which can be applied to a visible wavelength range of 400 nm to 800 nm and a UV wavelength range of 365 nm to 400 nm in the entire UV wavelength range of 10 nm to 400 nm.

Recently, demands for UV LEDs generating light in a UV wavelength range has been greatly increased. However, a transparent electrode having high conductivity and high transmittance in the UV wavelength range has not been developed, so that it is difficult to commercialize the UV LEDs.

For example, in the case of a UV LED where an ITO transparent electrode which is currently actively used is formed, most of light in a UV wavelength range of 10 nm to 320 nm generated in an activation layer is absorbed by an ITO layer, so that only about 1% of the light can be transmitted through the ITO layer to be extracted to an external portion.

FIG. 1 is a graph illustrating transmittance in the case where an ITO transparent electrode is formed on a p-GaN semiconductor layer in the related art. As illustrated in FIG. 1, although the transparent electrode has transmittance of 80% or more with respect to the light in a wavelength range of 350 nm or more, the transmittance is greatly decreased with respect to the light having a short wavelength in the UV wavelength range. Particularly, the transmittance is decreased to 20% or less with respect to the light having a short wavelength in the UV wavelength range of 280 nm or less.

In order to solve the above problem, in the related art, a metal electrode pad is directly formed on a semiconductor layer such as p-AlGaN instead of forming the transparent electrode on the semiconductor layer. However, the metal and the semiconductor layer are not in ohmic contact to each other because of a large difference in work function between the metal and the semiconductor layer, and current is concentrated on a metal electrode pad, but current is not supplied into the entire activation layer, so that an amount of the light generated by the activation layer is greatly decreased.

In order to solve the above problem, various researches have been made, but a transparent electrode having high conductivity and high transmittance in a UV wavelength range has not yet been developed. This is because conductivity and transmittance of a material is basically in trade-off relationship. Since a material having high transmittance in a UV wavelength range has a large band gap, the conductivity thereof is too low to be used as an electrode, and since the material is not in ohmic contact with a semiconductor material, it is impossible to use the above material as an electrode.

As an example of a technique for solving the above problem, a technique where a transparent electrode is constructed with a sliver (Ag) thin film is disclosed in Korean Patent Application No. 10-2007-0097545. However, in the related art, in the case where the transparent electrode is formed by using Ag, it is very difficult to deposit a thin silver layer on a semiconductor layer so that the thin sliver layer is in ohmic contact with the semiconductor layer. In addition, although a thin silver layer is deposited on the semiconductor layer, as illustrated in the graph of FIG. 4 of the above Patent Document, with respect to the light in a wavelength range 420 nm or less, the transmittance is greatly decreased to 80% or less; and with respect to the light in a wavelength range 380 nm or less, the transmittance is decreased to 50% or less. Therefore, the transmittance in the above-described technique has no difference from the transmittance of the ITO transparent electrode in the related art, and thus, it is difficult to improve the transmittance in a UV wavelength range up to a practical level.

SUMMARY OF THE INVENTION

The present invention is to provide a light emitting device including a transparent electrode having high transmittance with respect to light in a UV wavelength range as well as in a visible wavelength range and good ohmic contact characteristic with respect to a semiconductor layer and and a method of manufacturing the light emitting device.

According to an aspect of the present invention, there is provided a light emitting device including: a substrate; a first semiconductor layer which is formed on the substrate; an activation layer which is formed on the first semiconductor layer to generate light; a second semiconductor layer which is formed on the activation layer; and an transparent electrode which is formed on the second semiconductor layer by using a transparent insulating material of which resistance state is changed from a high resistance state into a low resistance state according to an applied electric field.

In the above aspect, the light emitting device may further include a reflective layer formed on the transparent electrode.

In addition, in the above aspect, the substrate and a submount substrate may be combined to each other so that the reflective layer is in contact with a first conductive pattern formed on the submount substrate and an electrode pad formed on an externally exposed portion of the first semiconductor layer is in contact with a second conductive pattern formed on the submount substrate through a bump.

According to another aspect of the present invention, there is provided a light emitting device including: a substrate; a reflective layer which is formed on the substrate; a transparent electrode which is formed on the reflective layer by using a transparent insulating material of which resistance state is changed from a high resistance state into a low resistance state according to an applied electric field; a second semiconductor layer which is formed on the transparent electrode; an activation layer which is formed on the second semiconductor layer to generate light; and a first semiconductor layer which is formed on the activation layer.

In the above aspect, a forming process may be performed on the transparent electrode by applying a threshold voltage or more inherent in a material of the transparent electrode, so that conducting filaments are formed in the transparent electrode.

In addition, in the above aspect, the first semiconductor layer may be formed with an n-AlGaN layer, and the second semiconductor layer is formed with a p-AlGaN layer or a p-AlGaN layer and a p-GaN thin film.

In addition, in the above aspect, the transparent electrode may be in ohmic contact with the second semiconductor layer.

In addition, in the above aspect, the transparent electrode may be formed with any one of a transparent oxide based material, a transparent nitride based material, a transparent polymer based material, and a transparent nano material.

In addition, in the above aspect, the light emitting device may further include a current spreading layer which is formed with CNT (carbon nano tube) or graphene between the second semiconductor layer and the transparent electrode.

In addition, in the above aspect, the light emitting device may further include a current spreading layer which is formed with CNT or graphene to be in contact with a surface of the transparent electrode opposite to a surface of the transparent electrode which is in contact with the second semiconductor layer.

According to still another aspect of the present invention, there is provided a method of manufacturing a light emitting device, including: (a) sequentially forming a first semiconductor layer, an activation layer which generates light, and a second semiconductor layer on a substrate; (b) forming a transparent electrode on the second semiconductor layer by using a transparent insulating material of which resistance state is to be changed from a high resistance state into a low resistance state according to an applied electric field; and (c) changing the resistance state of the transparent electrode into the low resistance state by applying a voltage to the transparent electrode.

In addition, in the above aspect, the method may further include (d) forming a reflective layer on the transparent electrode.

In addition, in the above aspect, the method may further include: (e) etching the transparent electrode, the second semiconductor layer, and the activation layer so that the first semiconductor layer is exposed and forming an electrode pad on the first semiconductor layer; and (f) combining the substrate with a submount substrate so that the reflective layer is in contact with a first conductive pattern formed on the submount substrate and the electrode pad is in contact with the second conductive pattern formed on the submount substrate through a bump.

In addition, in the above aspect, the method may further include: (e) forming a bonding layer on the reflective layer and attaching a submount substrate to the bonding layer; and (f) separating the substrate from the first semiconductor layer.

In addition, in the above aspect, the (c) changing of the resistance state may be performing a forming process by applying a threshold voltage or more to the transparent electrode, so that conducting filaments are formed in the transparent electrode.

In addition, in the above aspect, the first semiconductor layer may be formed with an n-AlGaN layer, and the second semiconductor layer is formed with a p-AlGaN layer or a p-AlGaN layer and a p-GaN thin film.

In addition, in the above aspect, the transparent electrode may be in ohmic contact with the second semiconductor layer.

In addition, in the above aspect, the transparent electrode may be formed with any one of a transparent oxide based material, a transparent nitride based material, a transparent polymer based material, and a transparent nano material.

In addition, in the above aspect, the method may further include, between the (a) sequentially forming of the first semiconductor layer, the activation layer which generates light, and the second semiconductor layer and the (b) forming of the transparent electrode, forming a current spreading layer on the second semiconductor layer by using CNT or graphene, wherein, in the (b) forming of the transparent electrode, the transparent electrode is formed on the current spreading layer.

In addition, in the above aspect, the method may further include forming a current spreading layer on the transparent electrode of which resistance state is changed into the low resistance state by using CNT or graphene.

According to the present invention, a transparent electrode of a light emitting device is formed by using a resistance change material which has high transmittance with respect to light in a UV wavelength range and of which resistance state is to be changed from a high resistance state into a low resistance state due to conducting filaments, which current can flow through, formed in the material if a voltage exceeding a threshold voltage inherent in a material applied to the material, so that it is possible to obtain high transmittance with respect to light in a UV wavelength range (particularly, light in a wavelength range of 340 nm to 280 nm and light in a wavelength range of 280 nm or less) as well as in a visible wavelength range generated by the light emitting device and to obtain good ohmic contact characteristic with respect to a semiconductor layer due to high conductivity of the transparent electrode.

In addition, according to the present invention, a current spreading layer formed by using CNT or graphene having good ohmic contact characteristic and high transmittance is formed on an upper or lower portion of a transparent electrode to connect conducting filaments formed in the transparent electrode, so that current flowing into the transparent electrode is allowed to spread through the entire semiconductor layer, and thus, it is possible to prevent the problem of current concentration from occurring.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described with reference to the attached drawings.

Figure 2:
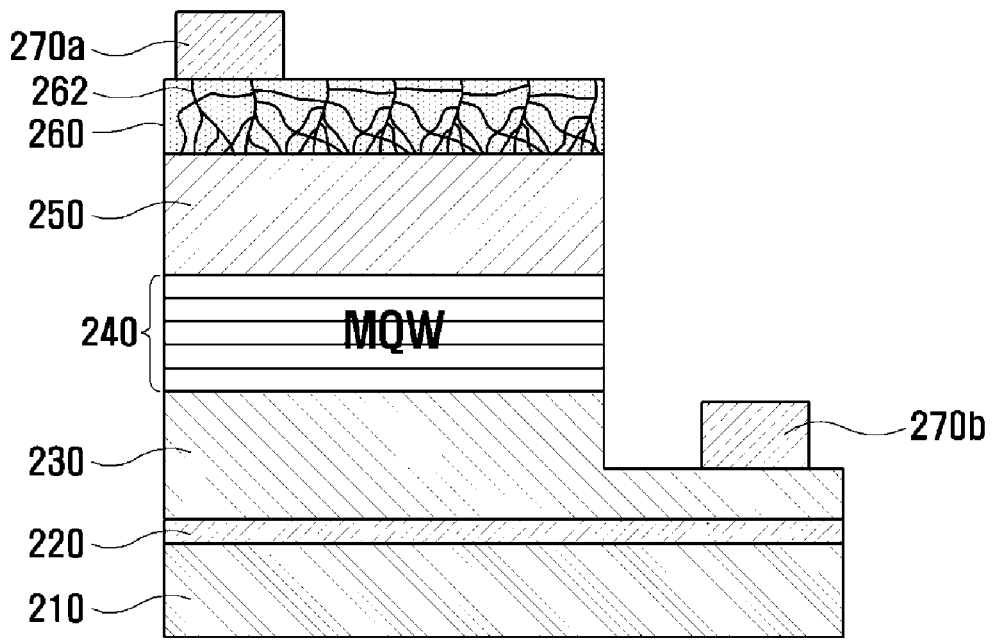
FIG. 2 is a diagram illustrating a configuration of a light emitting device including a transparent electrode according to a first embodiment of the present invention.

FIG. 2 is a diagram illustrating a configuration of a light emitting device including a transparent electrode 260 according to a first embodiment of the present invention.

Referring to FIG. 2, the light emitting device according to the first embodiment of the present invention is configured to include, a substrate 210 and a buffer layer 220, a first semiconductor layer 230, an activation layer 240, and a second semiconductor layer 250 which are sequentially formed on the substrate 210. In addition, the light emitting device is configured to include a transparent electrode 260 formed on the second semiconductor layer 250, an electrode pad 270a formed on an upper portion of the transparent electrode 260, and an electrode pad 270b formed on an upper portion of the first semiconductor layer 230 of which a portion region is etched to be exposed.

The substrate 210 may be constructed by using a substrate such as a sapphire substrate which is generally used for manufacturing a light emitting device. The buffer layer 220 may be formed with un-doped GaN or the like so as to allow the first semiconductor layer 230 to be easily grown, and if needed, the buffer layer 220 may be omitted.

The first semiconductor layer 230 is a semiconductor layer doped as an n type. In the embodiment of the present invention, the first semiconductor layer 230 is formed with n-AlGaN so as to generate light in a UV wavelength range. However, the first semiconductor layer 230 may also be formed with a general material used for manufacturing a light emitting device capable of generating light in a UV wavelength range.

The activation layer 240 (MQW) is preferably formed with Al(In)GaN/(In)GaN capable of generating light in a UV wavelength range. However, any material capable of generating light in a UV wavelength range can be used without limitation.

The second semiconductor layer 250 is a semiconductor layer doped as a p type. In the embodiment of the present invention, the second semiconductor layer 250 is formed with a single layer of p-AlGaN so as to generate light in a UV wavelength range, or the second semiconductor layer 250 is formed by sequentially forming a p-AlGaN layer and a p-GaN thin film on the activation layer 240. However, the second semiconductor layer 250 may also be formed with a general material used for manufacturing a light emitting device capable of generating light in a UV wavelength range.

In the above-described embodiment, the first semiconductor layer 230 and the second semiconductor layer 250 are semiconductor layers doped as an n type and a p type, respectively. The reverse case is also available.

The transparent electrode 260 according to the present invention is constructed with a transparent material (resistance change material) which has high transmittance with respect to light including light in a UV wavelength range and of which resistance state is to be changed according to an applied electric field. The resistance change material is mainly used in the field of ReRAM (resistive RAM). If a threshold voltage or more inherent in the material is applied to the material, electro-forming is performed, the resistance state of the resistance change material which is originally an insulating material is to be changed from a high resistance state into a low resistance state, so that the material has conductivity.

More specifically, if a threshold voltage or more is applied to the resistance change material which is an insulating material, electrode metal materials are diffused into a thin film due to electric stress (i.e., forming process), or a defective structure occurs in the thin film, so that conducting filaments 262 (or, metallic filaments) are formed in the resistance change material as illustrated in FIG. 2. After that, although the voltage applied to the material is removed, the conducting filaments 262 remain, and current can flow through the conducting filaments 262, so that the low resistance state of the material is maintained.

Figure 3A:
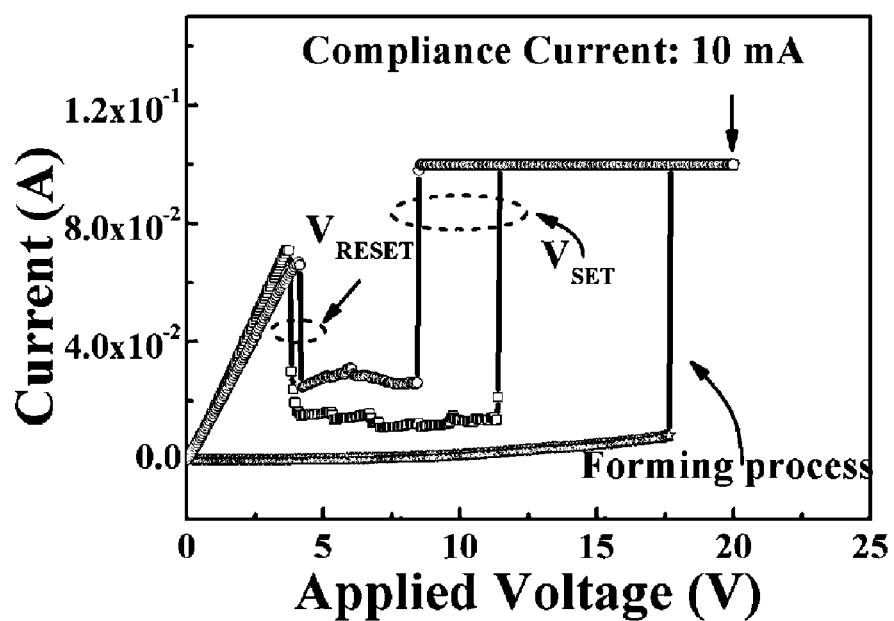
FIGS. 3a and 3b are diagrams illustrating characteristics of a resistance change material.

Referring to FIG. 3a, it can be seen that the resistance change material (for example, AlN) has an insulating characteristic before the forming process and has an I-V characteristic of a metal after the forming process.

Figure 3B:
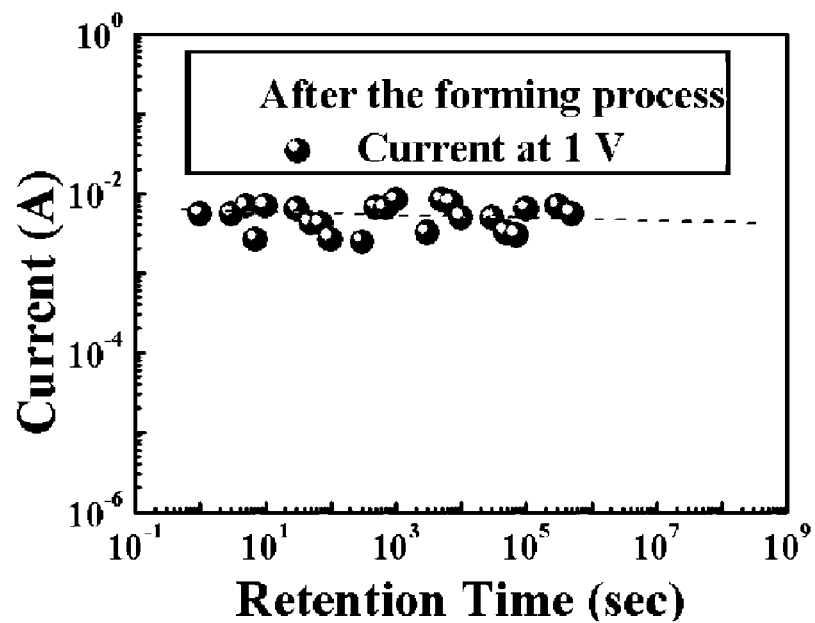

FIG. 3b is a graph illustrating how long the resistance state can be stably maintained after the conducting filaments 262 are formed. It can be seen from a dotted line in the graph that the low resistance state can be stably maintained for ten years after the conducting filaments 262 are formed.

In the embodiment of the present invention, a transparent conductive oxide based material ($SiO_2$, $Ga_2O_3$, $Al_2O_3$, ZnO, ITO, or the like), a transparent conductive nitride based material ($Si_3N_4$, AlN, GaN, InN, or the like), a transparent conductive polymer based material (polyaniline (PANI)), poly(ethylenedioxythiophene)-polystyrene sulfonate (PEDOT: PSS) or the like), and a transparent conductive nano material (CNT, CNT-oxide, Graphene, Graphene-oxide, or the like) or the like may be used as the resistance change material. In addition to the above-described materials, any material which is transparent and has the above-described resistance change characteristic can be used to form the transparent electrode 260 according to the present invention. It should be noted that the statement that the material has conductivity denotes that the material is allowed to have conductivity as a result of the forming process by which the conducting filaments 262 are formed in the transparent electrode. In addition, it should be noted that the the forming process is performed on the transparent electrode 260 according to the present invention, so that the conducting filaments are formed in the transparent electrode.

As illustrated in FIG. 2, if the light emitting device is completed, current injected through the electrode pads 270a formed on the transparent electrode 260 is allowed to spread through the conducting filaments 262, which are connected to each other in the transparent electrode 260, over the entire area to be injected into the entire second semiconductor layer 250. The light generated in the activation layer 240, particularly, the light in a UV wavelength range is emitted through the transparent electrode 260 having a large band gap to an external portion.

Figure 4:
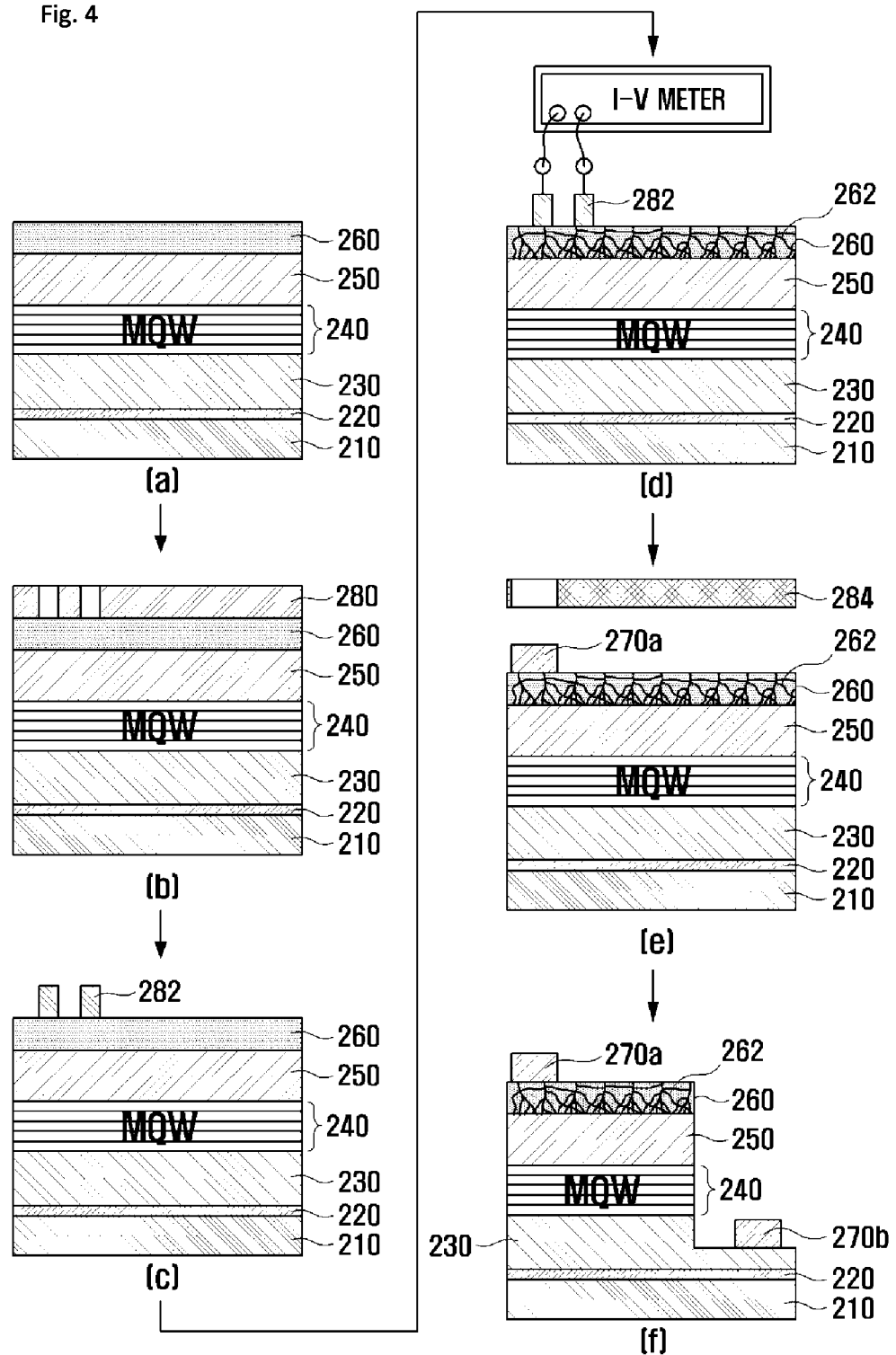
FIG. 4 is a diagram illustrating a method of manufacturing the light emitting device according to the first embodiment of the present invention.

FIG. 4 is a diagram illustrating a method of manufacturing the light emitting device according to the first embodiment of the present invention.

The method of manufacturing the light emitting device according to the first embodiment of the present invention will be described with reference to FIG. 4. First, by using the same method as a method of manufacturing a light emitting device in the related art, a buffer layer 220, a first semiconductor layer 230, an activation layer 240, and a second semiconductor layer 250 is formed on a substrate 210. Next, by using the same method as a general method of fabricating a transparent electrode, a transparent electrode 260 is formed with a resistance change material described above on the second semiconductor layer 250 (refer to (a) of FIG. 4).

Next, a photoresist layer 280 is formed on the transparent electrode 260, and by performing a photolithography process, a pattern for forming a forming electrode 282 is formed on a portion of a region where a metal pad 270a is to be formed in the photoresist layer 280 (refer to (b) of FIG. 4). Next, by performing an e-beam process, a sputtering process, or other metal deposition processes, the forming electrode 282 is formed in the pattern. Next, the forming electrode 282 is completed by removing the photoresist layer 280 except for the forming electrode 282 through a lift-off process.

Next, as illustrated in (d) of FIG. 4, if a threshold voltage or more inherent in the material is applied to the forming electrode 282 formed on the transparent electrode 260, conducting filaments 262 are formed in the transparent electrode 260 which is an insulating material, so that the resistance state of the transparent electrode 260 is changed from a high resistance state into a low resistance state.

After the conducting filaments 262 are formed in the transparent electrode 260, a metal electrode pad 270a is formed on the transparent electrode 260 (refer to (e) of FIG. 4). At this time, as a method of forming the metal electrode pads 270a, the forming electrode 282 for performing the forming process may be removed, and a separate metal electrode pad 270a may be formed. Alternatively, as illustrated in (e) of FIG. 4, metal is additionally deposited on the forming electrode 282 by using a mask 284, so that the metal electrode pad 270a may be formed.

Next, by using the same method as a general method of manufacturing a horizontal type light emitting device, the second semiconductor layer 250 and the activation layer 240 are sequentially etched from the transparent electrode 260 so as to allow the first semiconductor layer 230 to be exposed, and the n-type electrode pad 270b is formed on the first semiconductor layer 230 (refer to (f) of FIG. 4).

Hereinbefore, the light emitting device according to the first embodiment of the present invention and the method of manufacturing the light emitting device are described.

In the first embodiment described above with reference to FIGS. 2 to 4, some conducting filaments 262 formed in the transparent electrode 260 may not be connected to other conducting filaments 262. In this case, current flowing into the transparent electrode 260 may not spread over the entire transparent electrode 260 but be concentrated to be localized, so that a problem of current concentration that current is concentrated to be localized on the second semiconductor layer 250 which is in contact with the transparent electrode 260 may occur.

Figure 5A:
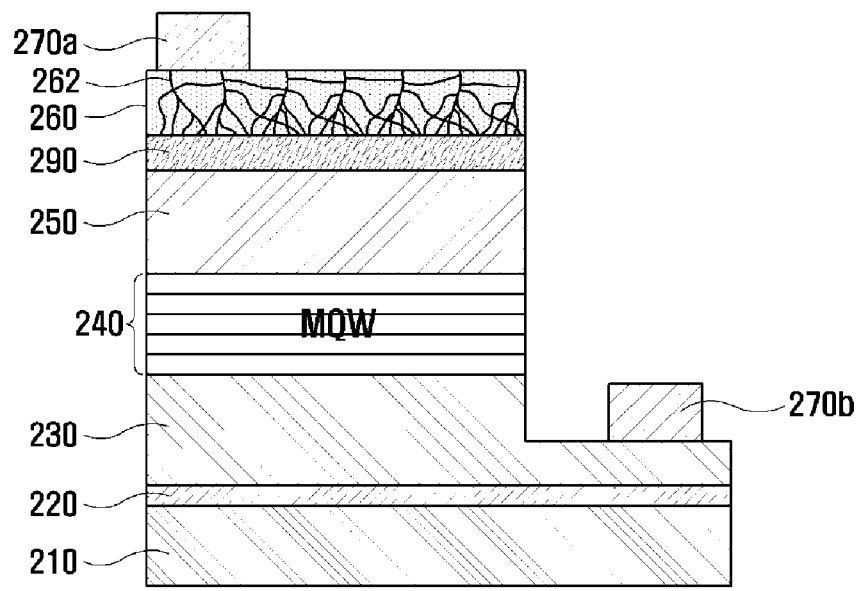
FIGS. 5a and 5b are diagrams illustrating a configuration of a light emitting device according to a modified example of the first embodiment of the present invention in order to solve a problem of current concentration.
Figure 5B:
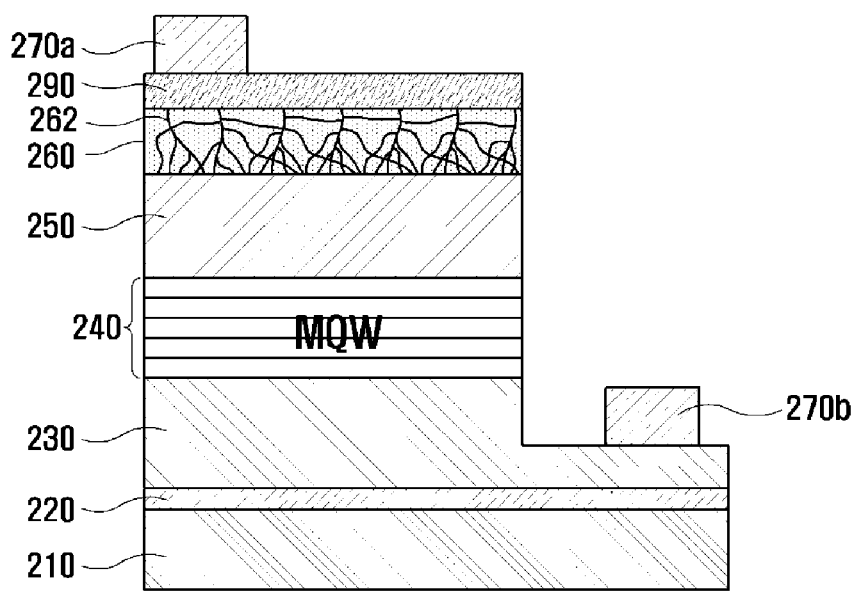

FIGS. 5a and 5b are diagrams illustrating configurations of light emitting devices according to modified examples of the first embodiment of the present invention for solving the problem of current concentration.

In the examples illustrated in FIGS. 5a and 5b, in order to improve the current spreading characteristic of the transparent electrode 260, a current spreading layer 290 formed by using CNT (carbon nano tube) or graphene which connects the conducting filaments 262 formed on the transparent electrode 260 is formed on an upper surface or a lower surface of the transparent electrode 260. FIG. 5a illustrates an example where the current spreading layer 290 formed by using CNT or graphene is formed on the transparent electrode 260. FIG. 5b illustrates an example where the current spreading layer 290 formed by using CNT or graphene is formed between the transparent electrode 260 and the second semiconductor layer 250.

The CNT and the graphene have good conductivity and transmittance characteristics. In the present invention, the conducting filaments 262 in the transparent electrode 260 are connected to each other by forming the current spreading layer 290 with CNT or graphene on one surface of the transparent electrode 260 by using the characteristics, so that the current flowing into the transparent electrode 260 can be allowed to spread over the entire second semiconductor layer 250.

At this time, as the thickness of the current spreading layer 290 is increased, the CNTs or graphenes in the current spreading layer 290 are connected to each other, and thus, the possibility that the conducting filaments 262 are connected to each other is increased. As a result, the conductivity of the transparent electrode 260 is increased, but the transmittance thereof is decreased. Therefore, it is preferable that the current spreading layer 290 according to the present invention is formed with thinness enough to connect the conducting filaments 262 in the transparent electrode 260 to each other and as thin as possible within a range where the transmittance is not deteriorated.

In the embodiment of the present invention illustrated in FIGS. 5a and 5b, the current spreading layer 290 is formed with a thickness of about 2 nm to about 100 nm. The thickness of 2 nm is a minimum thickness so that a single layer of CNT or graphene can be formed, and the thickness of 100 nm is a maximum thickness so that transmittance can be maintained to be 80% or more.

The configurations of the examples illustrated in FIGS. 5a and 5b are the same as those of the example described with reference to FIGS. 2 to 4, except that the current spreading layer 290 is formed with CNT or graphene just before or after the transparent electrode 260 is formed, and thus, the detailed description thereof is omitted.

Figure 6A:
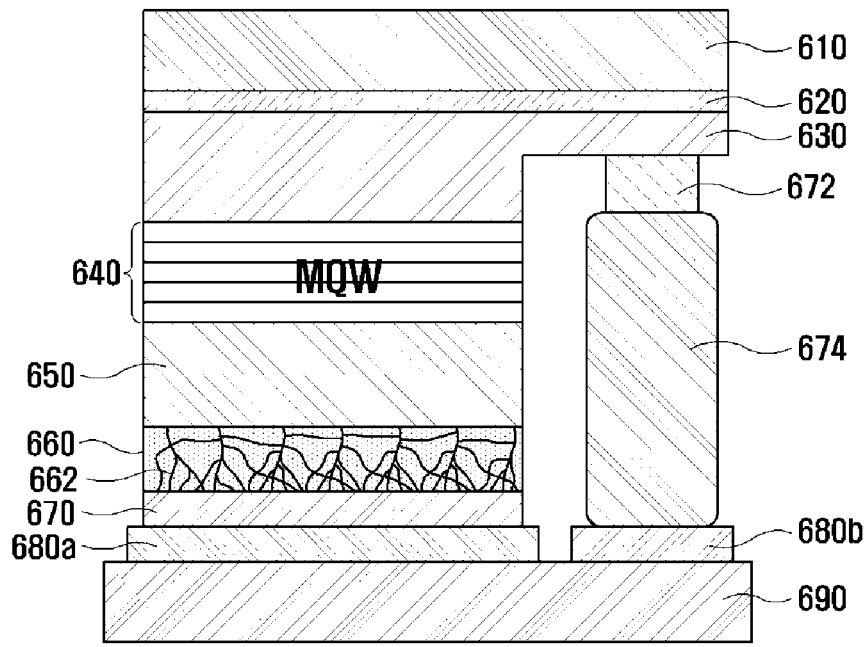
FIG. 6a is a diagram illustrating a configuration of a light emitting device according to a second embodiment of the present invention.
Figure 6B:
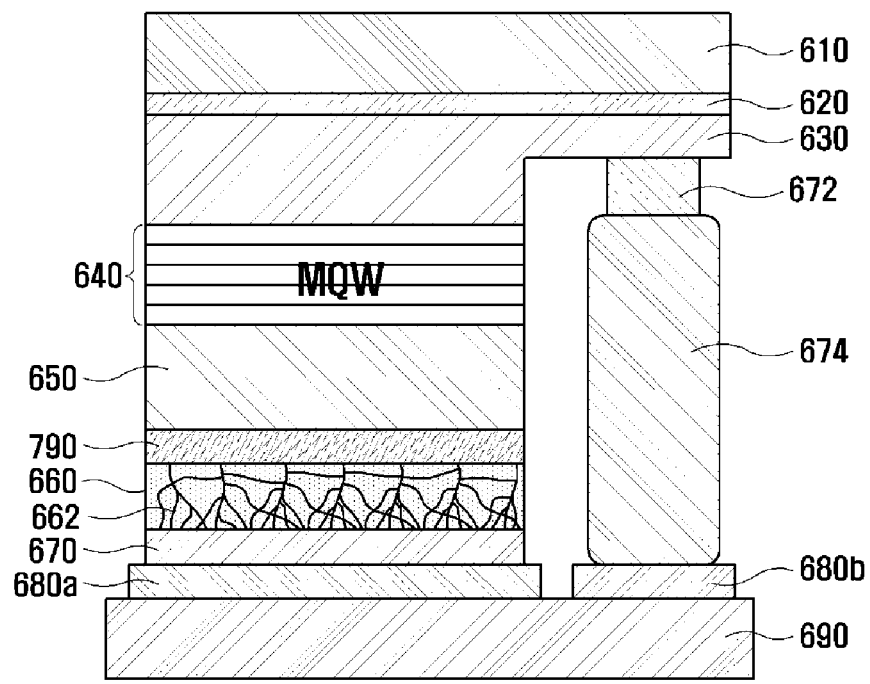
FIG. 6b is a diagram illustrating a modified example of the second embodiment.

FIG. 6a is a diagram illustrating a configuration of a light emitting device according to a second embodiment of the present invention. FIG. 6b is a diagram illustrating a modified example of the second embodiment;

First, referring to FIG. 6a, the light emitting device according to the second embodiment of the present invention has a flip-chip structure where light generated in an activation layer is emitted in the direction of a substrate. The light emitting device is configured by further including a transparent electrode formed by using a resistance change material of the present invention, in which conducting filaments are formed, between a semiconductor layer (p-GaN) and a reflective layer in addition to the light emitting device having a flip-chip structure in the related art.

In the second embodiment illustrated in FIG. 6a, the surface where a substrate 610 is disposed is referred to as a lower surface. In the same manner as that of the horizontal type light emitting device described with reference to FIGS. 2 to 4, a substrate 610, a buffer layer 620, a first semiconductor layer 630, an activation layer 640, and a second semiconductor layer 650 are sequentially formed, a transparent electrode 660 where conducting filaments 662 are formed by performing a forming process is formed on the second semiconductor layer 650, and a reflective layer 670 is formed on the transparent electrode 660. Herein, the above-described components of the substrate 610 to the transparent electrode 660 may be formed by using the same material and manner as those of the components of the substrate 210 to the transparent electrode 260 illustrated in FIG. 2, and the reflective layer 670 may be formed by using Ag, Al, or the like which is used for a light emitting device having a general flip-chip structure.

After the reflective layer 670 is formed, the reflective layer 670 is connected to a first conductive pattern 680a formed on a submount substrate 690, and an electrode pad 672 formed on the first semiconductor layer 630 is connected to a second conductive pattern 680b formed on the submount substrate 690 by a bump 674, so that the current can be supplied.

The current injected through the first conductive pattern 680a is applied to the transparent electrode 660 through the reflective layer 670 and is allowed to spread through conducting filaments 662 formed in the transparent electrode 660 over the entire second semiconductor layer 650.

The light generated in the activation layer 640 is directed to the upper side where the first semiconductor layer 630 is disposed and to the lower side where the second semiconductor layer 650 is disposed. The light directed to the lower side passes through the transparent electrode 660 and is reflected by the reflective layer 670 to be directed to the upper side. Subsequently, the light passes through the semiconductor substrate 610 to be emitted to an external portion.

At this time, since the transparent electrode according to the present invention 660 is in a low resistance state due to the conducting filaments 662, the transparent electrode has a good ohmic contact characteristic with respect to the second semiconductor layer 650 and the reflective layer 660. In addition, since the transparent electrode is constructed with a material having a large band gap and having high transmittance with respect to the light in a UV wavelength range, the transparent electrode has high transmittance.

Figure 7:
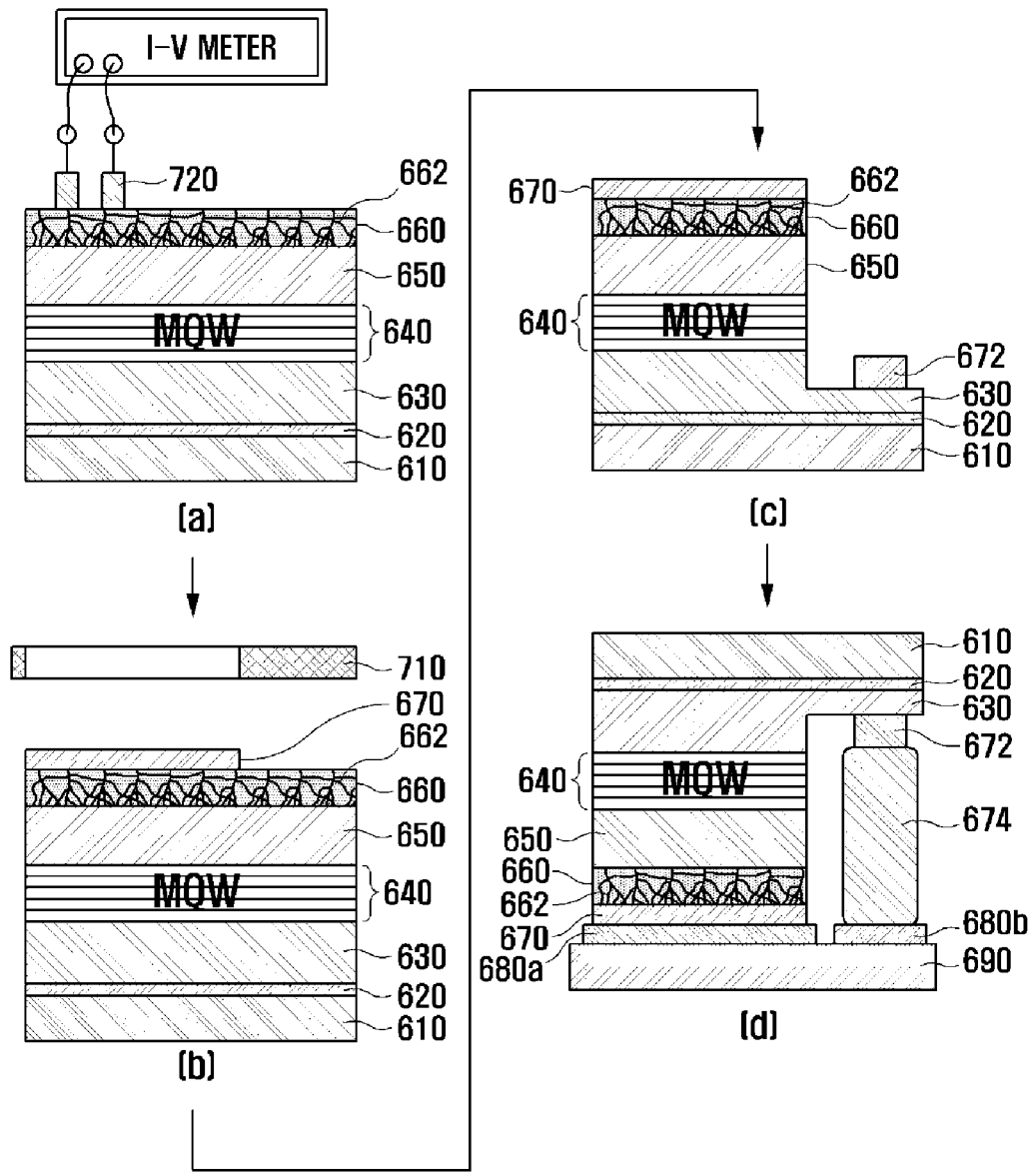
FIG. 7 is a diagram illustrating a method of manufacturing a light emitting device according to the second embodiment of the present invention.

FIG. 7 is a diagram illustrating a method of manufacturing a light emitting device according to the second embodiment of the present invention.

The method of manufacturing the light emitting device according to a second embodiment of the present invention will be described with reference to FIG. 7. The transparent electrode 660 where the conducting filaments 662 are formed by performing the above-described steps of (a) to (d) of FIG. 4 is formed on the second semiconductor layer 650 (refer to (a) of FIG. 7). After the forming electrode is removed, the reflective layer 670 is formed on the second semiconductor layer 650 (refer to (b) of FIG. 7). At this time, the reflective layer 670 may be formed over the entire transparent electrode 660. Alternatively, the reflective layer 670 may also be formed only the area of the first semiconductor layer 630 by using the metal mask 710 except for the area which is to be etched in order to form the electrode pad 672 on the first semiconductor layer 630.

Next, in order to form the electrode pad 672 on the first semiconductor layer 630, a predetermined area of the light emitting device is etched so as to expose the first semiconductor layer 630 from the transparent electrode 660 (or the reflective layer 670), and the electrode pad 672 is formed on the first semiconductor layer 630 (refer to (c) of FIG. 7).

Next, the submount substrate 690 where the first conductive pattern 680a the second conductive pattern 680b are formed is prepared, the reflective layer 670 is bonded to the first conductive pattern 680a, and the second conductive pattern 680b and the electrode pad 672 formed on the first semiconductor layer 630 are bonded to each other through a bump 674. The light emitting device is faced down and the submount substrate 690 is bonded, so that the light emitting device having a flip-chip structure is completed (refer to (d) of FIG. 7).

FIG. 6b is a diagram illustrating a modified example of the second embodiment of the present invention. In the case where a portion of the conducting filaments 662 formed in the transparent electrode 660 is not connected to other conducting filaments 662, in order to prevent current from being concentrated on the second semiconductor layer 650 through only the portion of the conducting filaments 662, the current spreading layer 690 formed by using CNT or graphene is additionally formed between the second semiconductor layer 650 and the transparent electrode 660. Although the current spreading layer 690 is additionally formed between the second semiconductor layer 650 and the transparent electrode 660 in FIG. 6b, the current spreading layer 690 may be additionally formed between the transparent electrode 660 and the reflective layer 670.

Figure 8A:
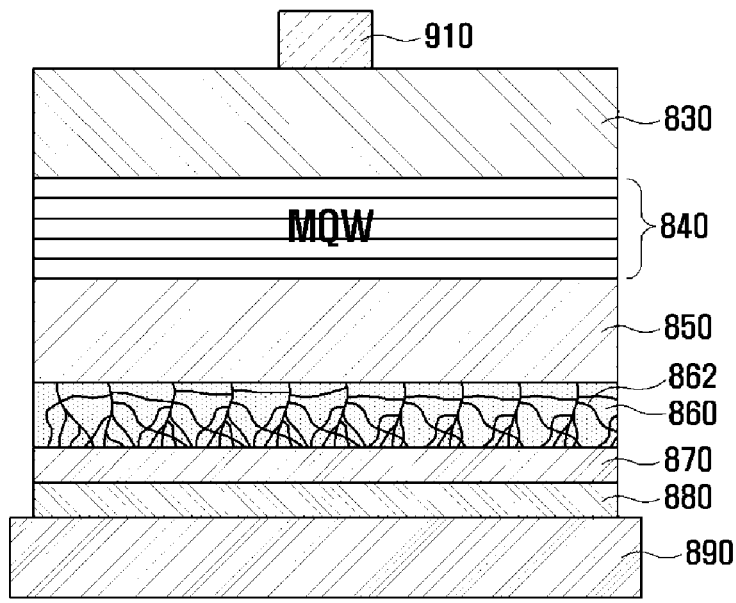
FIG. 8a is a diagram illustrating a configuration of a light emitting device according to a third embodiment of the present invention.
Figure 8B:
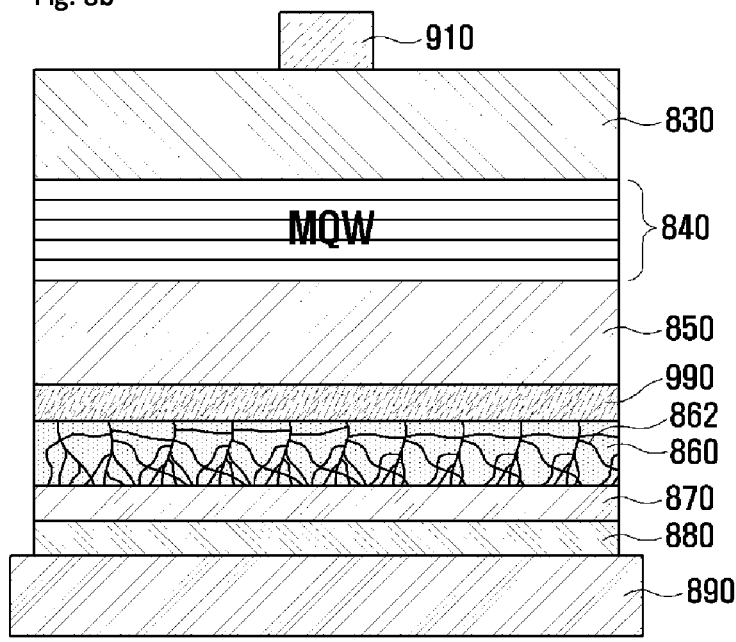
FIG. 8b is a diagram illustrating a configuration of a light emitting device according to a modified example of the third embodiment.

FIG. 8a is a diagram illustrating a configuration of a light emitting device according to a third embodiment of the present invention. FIG. 8b is a diagram illustrating a configuration of a light emitting device according to a modified example of the third embodiment.

The light emitting device according to the third embodiment of the present invention is a vertical type light emitting device. The transparent electrode formed by using a resistance change material in which the conducting filaments are formed is additionally formed between the reflective layer and the second semiconductor layer (for example, p-GaN layer) in a configuration of a general vertical type light emitting device.

Referring to FIG. 8a, the light emitting device according to the third embodiment of the present invention is configured by sequentially forming a submount substrate 890, an bonding layer 880, a reflective layer 870, a transparent electrode 860, a second semiconductor layer 850, an activation layer 840, a first semiconductor layer 830, and an electrode pad 910.

In the third embodiment, the submount substrate 890 is constructed with a metal substrate into which current can be injected. The reflective layer 870 is formed on the metal substrate 810 by using a material such as Al or Ag which is generally used for the reflective layer 870 of the light emitting device. The reflective layer 870 reflects the light generated in the activation layer 840 to direct the light toward the upper side.

Similarly to the first and second embodiments, the transparent electrode 860 formed on the reflective layer is formed by using a transparent resistance change material which can pass the light in a UV wavelength range and of which resistance state is to be changed from a high resistance state into a low resistance state due to the conducting filaments formed in the material if a threshold voltage or more inherent in the material is applied to the material. In addition, similarly to the first and second embodiments, the conducting filaments 862 are formed in the transparent electrode due to the forming process, so that the low resistance state of the transparent electrode is maintained; and the current applied from the reflective layer 870 is allowed to spread over the entire area through the conducting filaments 862 formed in the transparent electrode 860, so that the current is injected into the second semiconductor layer 850.

The second semiconductor layer 850 is a semiconductor layer doped as a p type. In the embodiment of the present invention, the second semiconductor layer 850 is formed by using a single layer of p-AlGaN so as to generate light in a UV wavelength range. Alternatively, the second semiconductor layer 850 may be formed by sequentially forming a p-GaN thin film and a p-AlGaN layer on the transparent electrode. However, the second semiconductor layer 850 may be formed by using a general material used for manufacturing a light emitting device capable of generating light in a UV wavelength range.

The activation layer 840 (MQW) is preferably formed by using Al(In)GaN/(In)GaN so as to generate light in a UV wavelength range. However, any material capable of generating light in a UV wavelength range can be used without limitation.

The first semiconductor layer 830 is a semiconductor layer doped as an n type. In the embodiment of the present invention, the first semiconductor layer 830 is formed by using n-AlGaN so as to generate light in a UV wavelength range. However, the first semiconductor layer 830 may also be formed by using a general material used for manufacturing a light emitting device capable of generating light in a UV wavelength range.

In the above-described embodiment, the first semiconductor layer 830 and the second semiconductor layer 850 are semiconductor layers doped as an n type and a p type, respectively. The reverse case is also available.

Figure 9:
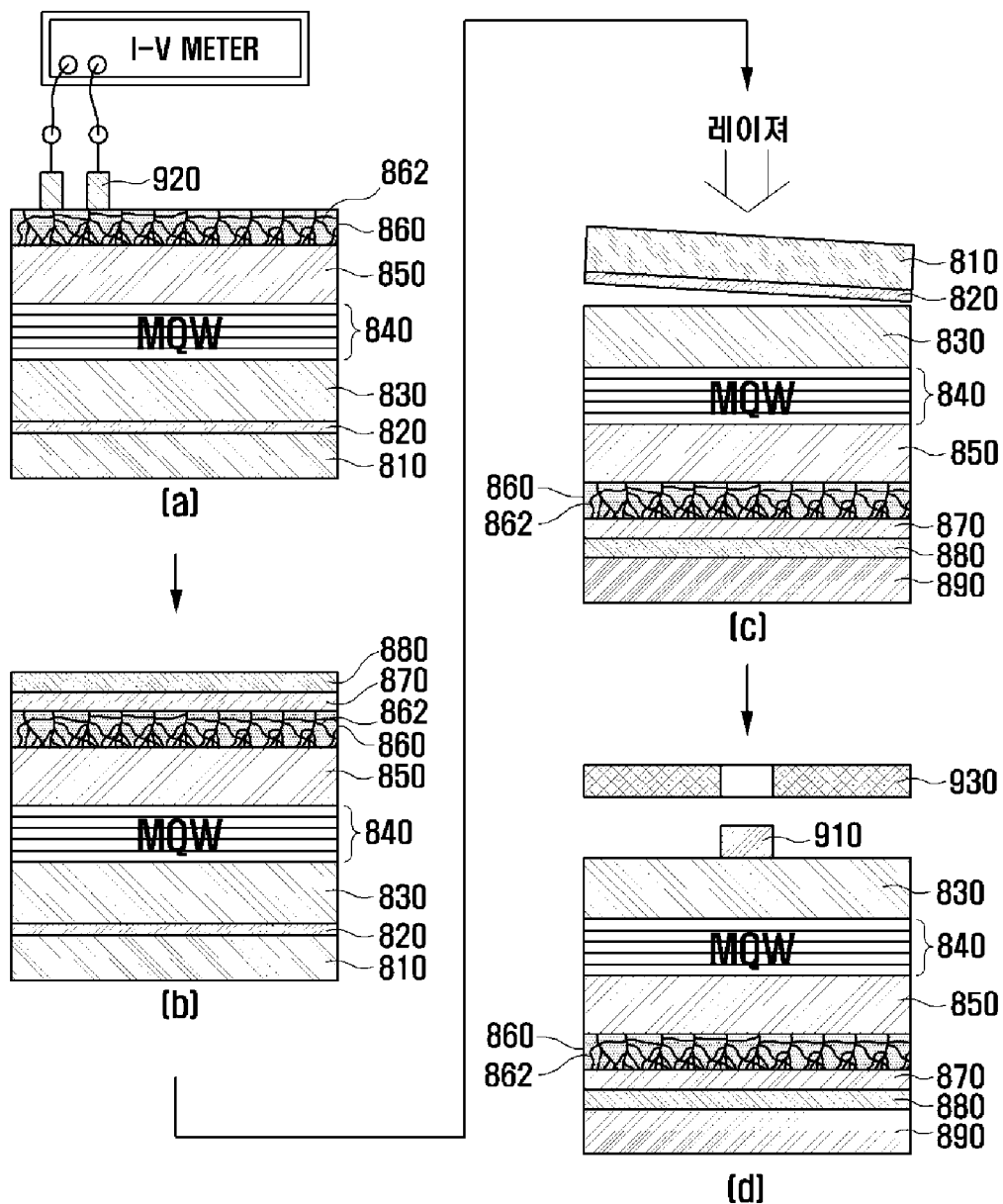
FIG. 9 is a diagram illustrating a method of manufacturing the light emitting device according to the third embodiment of the present invention.

FIG. 9 is a diagram illustrating a method of manufacturing the light emitting device according to the third embodiment of the present invention.

Referring to FIG. 9, by performing the same processes as Steps (a) to (d) of FIG. 4, the buffer layer 820, the first semiconductor layer 830, the activation layer 840, the second semiconductor layer 850, and the transparent electrode 860 are sequentially formed on the substrate such as sapphire substrate 810, and the conducting filaments 862 are formed in the transparent electrode 860 by performing the forming process on the transparent electrode 860, so that the resistance state of the transparent electrode 860 is changed into a low resistance state (refer to (a) of FIG. 9).

At this time, the buffer layer 820 may be formed by using an un-doped GaN layer; the first semiconductor layer 830 may be formed by using an n-AlGaN layer; and the activation layer 840 (MQW) is formed by using Al(In)GaN/(In)GaN so as to generate light in an UV wavelength range; and the second semiconductor layer 850 is formed by using a single layer of p-AlGaN or a p-AlGaN layer and a p-GaN thin film.

As described above, the transparent electrode 860 formed on the second semiconductor layer 850 is formed by using the material which has high transmittance with respect to light in an UV wavelength range and of which resistance state is to be changed into a low resistance state due to the conducting filaments 862 formed in the transparent electrode 860 if a threshold voltage or more is applied to the transparent electrode 860. Next, the forming process is performed by applying the threshold voltage or more, so that the conducting filaments 862 are formed in the transparent electrode 860. Since the example of the resistance change material is described above, the detailed description thereof is omitted.

Next, the reflective layer 870 is formed on the transparent electrode 860 by using a metal such as Ag or Al, and an bonding layer 880 for bonding to the submount substrate 880 is formed on the reflective layer 870, so that a light emitting structure is completed (refer to (b) of FIG. 9).

Next, the bonding layer 880 of the light emitting structure is bonded to the submount substrate 880 so that the sapphire substrate 810 is disposed at the upper side. In order to separate the sapphire substrate 810 from the light emitting device, a UV laser beam having a wavelength range of 245 nm to 305 nm is irradiated through the sapphire substrate 810. The irradiated UV laser beam is absorbed by the buffer layer 820, and the material GaN of the buffer layer 820 is decomposed into Ga and $N_2$, so that the sapphire substrate 810 is separated from the light emitting device (refer to (c) of FIG. 9).

Next, the remaining material remaining on the first semiconductor layer 830 is removed, and an n-type electrode pad is formed on the first semiconductor layer 830, so that the light emitting device is completed (refer to (d) of FIG. 9).

In the method of manufacturing the vertical type light emitting device according to the third embodiment, the processes except for the process of forming the transparent electrode 860 and the processes of performing the forming process are the same as those of a general method of manufacturing a vertical type light emitting device, and thus, the detailed description thereof is omitted.

On the other hand, similarly to the above-described first and second embodiments, in the third embodiment, in order to prevent current from being concentrated on some area due to disconnection of some conducting filaments 862 in the transparent electrode 860 to other conducting filaments 862, in Step (b) of FIG. 9, a current spreading layer 990 formed by using CNT or graphene may be further formed between the transparent electrode 860 and the second semiconductor layer 850, or a current spreading layer formed by using CNT or graphene may be formed on the transparent electrode 860, and the reflective layer 870 may be formed on the current spreading layer.

The modified example of the third embodiment of the present invention is illustrated in FIG. 8b. Referring to FIG. 8b, the current spreading layer 990 formed by using CNT or graphene is formed between the second semiconductor layer 850 and the reflective layer 870. The current flowing through the reflective layer 870 is allowed to primarily spread through the conducting filaments 862 in the transparent electrode 860 and to spread from the current spreading layer which is in contact with the transparent electrode 860 into the entire second semiconductor layer 850, so that the current is uniformly injected.

On the other hand, it can be understood by the ordinarily skilled that, although the current spreading layer 990 is formed between the transparent electrode 860 and the reflective layer 870 as described above, the same effect can be obtained.

In the light emitting device according to the third embodiment of the present invention described hereinbefore, the transparent electrode is formed by using a resistance change material having high transmittance with respect to light in a UV wavelength range and good ohmic contact characteristic due to the conducting filaments, so that the transmittance and electrical characteristics of the light emitting device can be improved.

FIGS. 10a to 10e are graphs illustrating a transmittance characteristic, an ohmic characteristic before the forming process, a contact resistance characteristic before the forming process, an ohmic characteristic after the forming process, and a contact resistance characteristic after the forming process of a transparent electrode in the case where the transparent electrode is formed on a p-GaN semiconductor layer which is to be used as a second semiconductor layer of the above-described light emitting device according to the present invention by using a $Ga_2O_3$ material which is a resistance change material which is to be used to form the transparent electrode according to the present invention.

In the example illustrated in FIGS. 10a to 10e, a transparent electrode (thickness: about 80 nm) is formed on a p-GaN semiconductor layer by using a $Ga_2O_3$ material.

Figure 1:
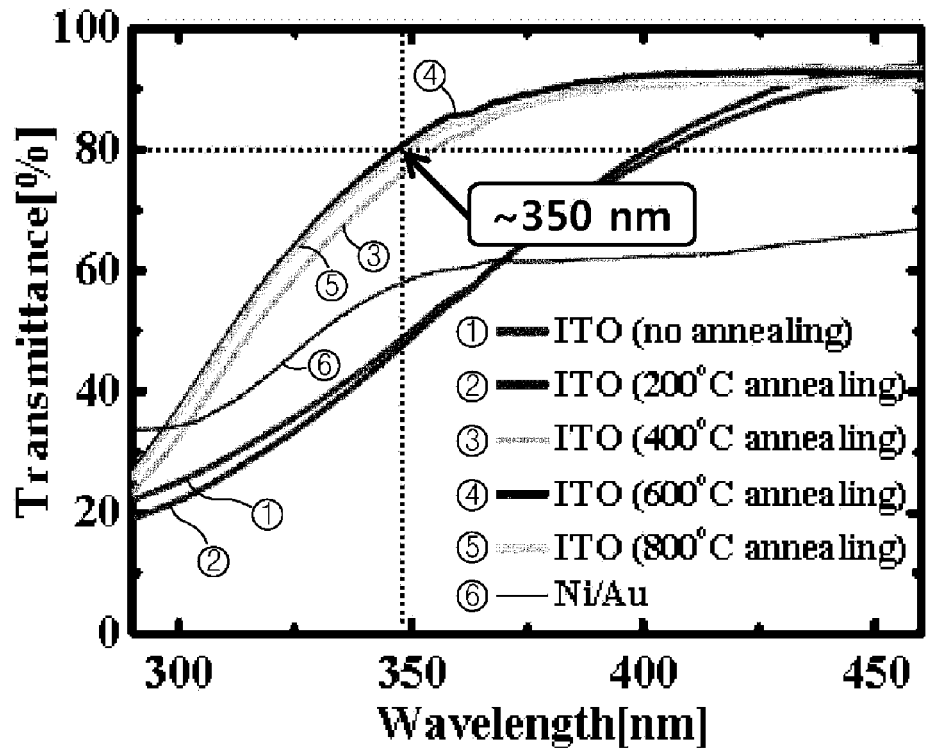
FIG. 1 is a diagram illustrating transmittance in the case where an ITO transparent electrode is formed on a p-GaN semiconductor layer in the related art.
Figure 10A:
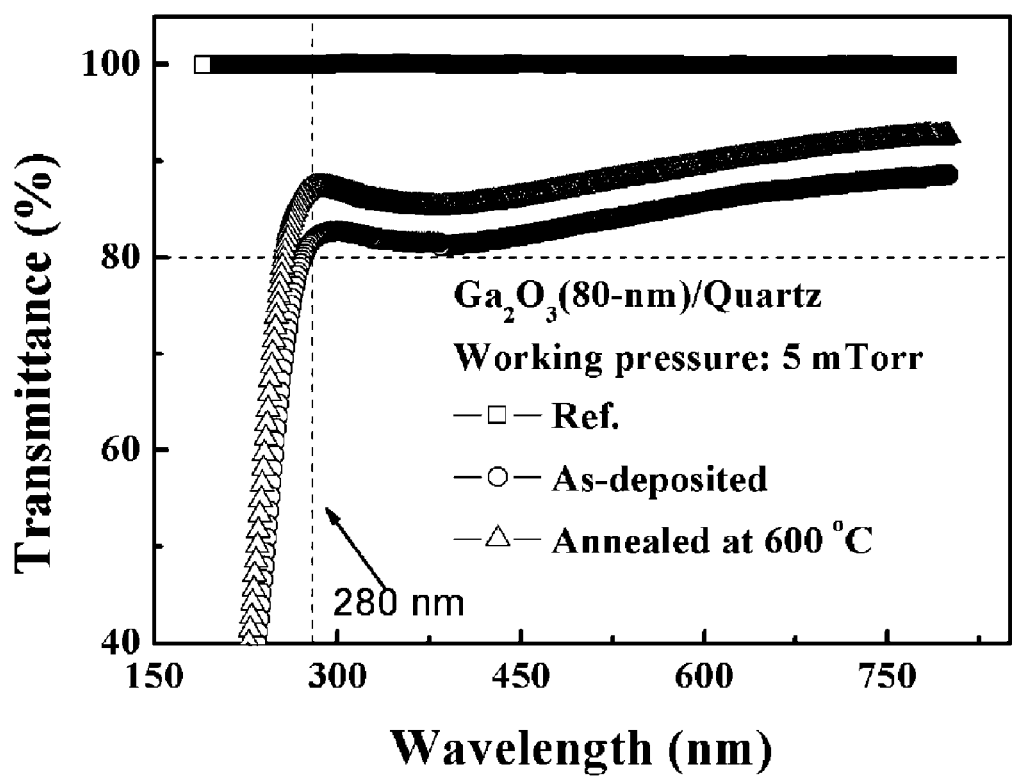
FIGS. 10a to 10e are graphs illustrating a transmittance characteristic, an ohmic characteristic before the forming process, a contact resistance characteristic before the forming process, an ohmic characteristic after the forming process, and a contact resistance characteristic after the forming process in the case where a transparent electrode is formed on a p-GaN semiconductor layer by using a $Ga_2O_3$ material.

Referring to the graph illustrated in FIG. 10a, in the example, it can be understood that the $Ga_2O_3$ transparent electrode has transmittance of 80% or more with respect to the light in a UV wavelength range of 264 nm or more. It can be understood that the transmittance of the transparent electrode of the example is also greatly improved in comparison to the transmittance of 20% of the ITO transparent electrode in the related art illustrated in FIG. 1.

FIGS. 10b to 10e illustrate ohmic characteristics (FIGS. 10b and 10d) and contact resistance characteristics (FIGS. 10c and 10e) measured by using a TLM (Transfer Length Method) pattern in the case where a distance between measurement electrodes is 2 μm, 4 μm, 6 μm, 8 μm, and 10 μm.

Figure 10B:
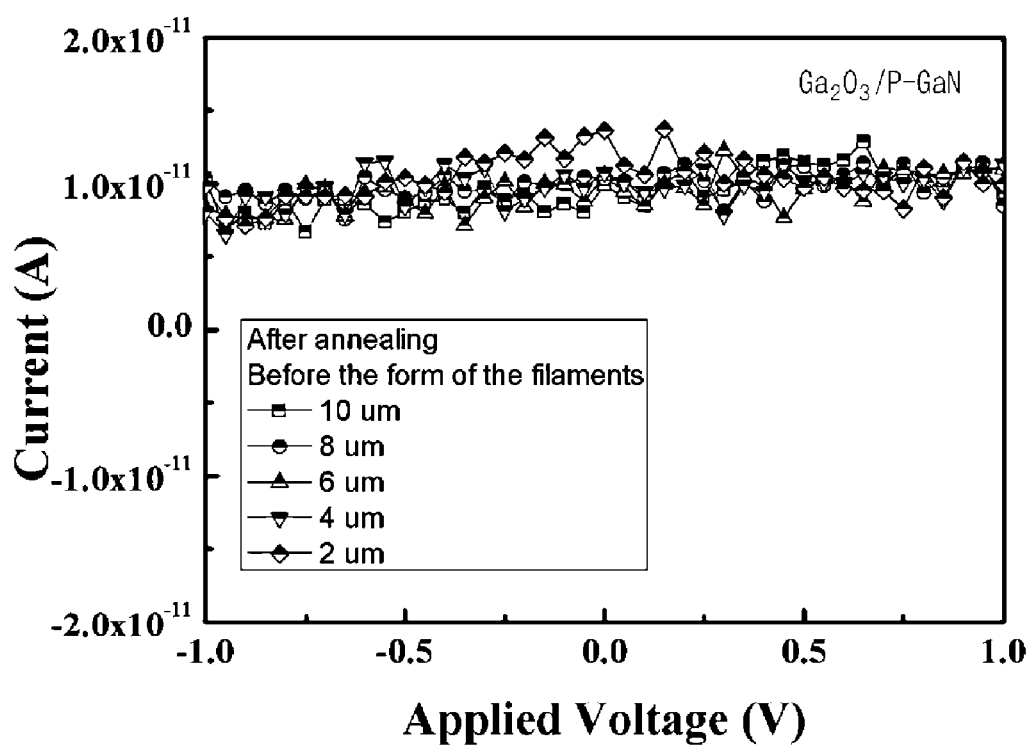
Figure 10C:
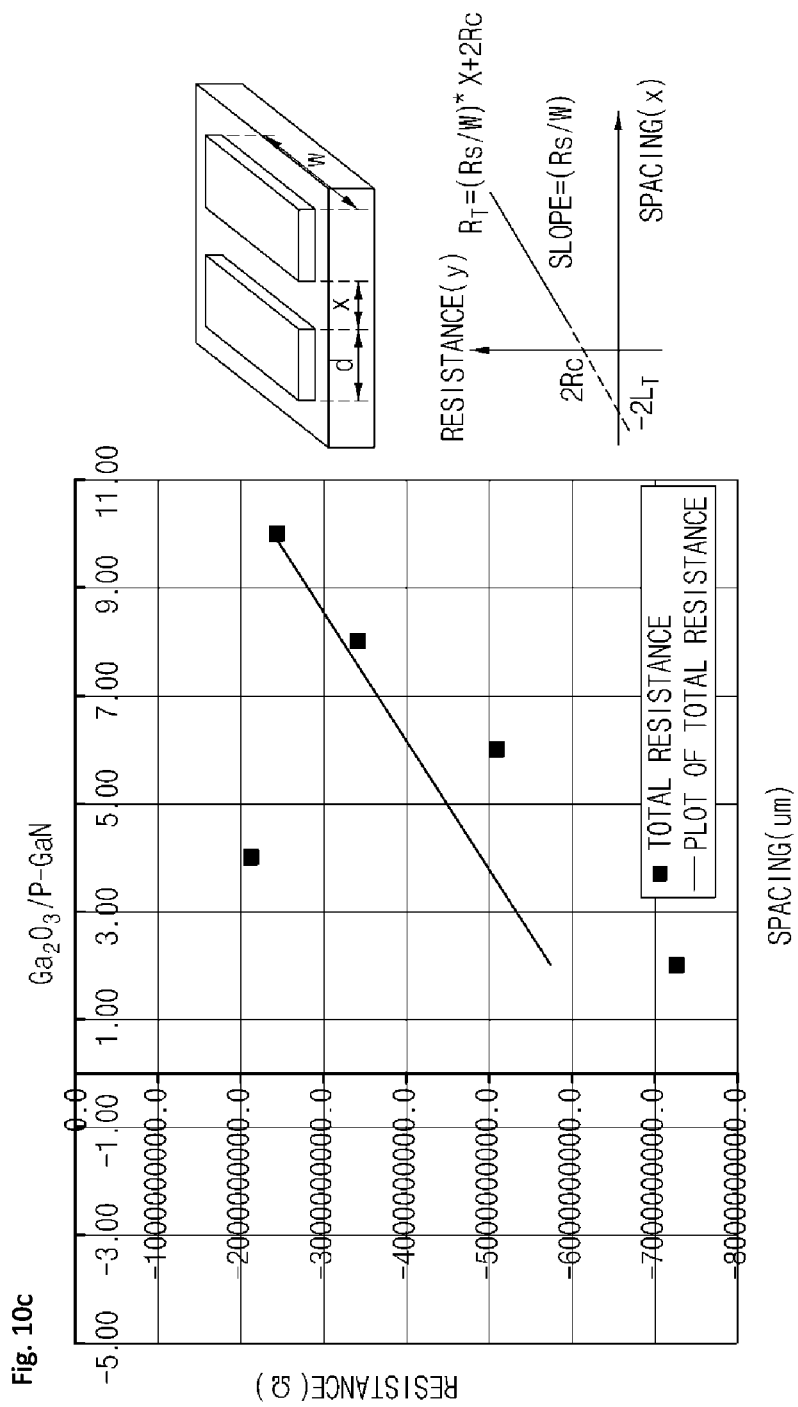

Referring to FIG. 10b, it can be understood that, in the case where the distance between measurement electrodes is 2 μm, before the forming process, the current flowing into the transparent electrode is about $1.0 \times 10^{-11}$ A irrespective of the applied voltage, so that the transparent electrode does not have ohmic characteristic. In addition, referring to FIG. 10c, it can be understood that the ohmic contact resistance characteristic does not have linearity.

Figure 10D:
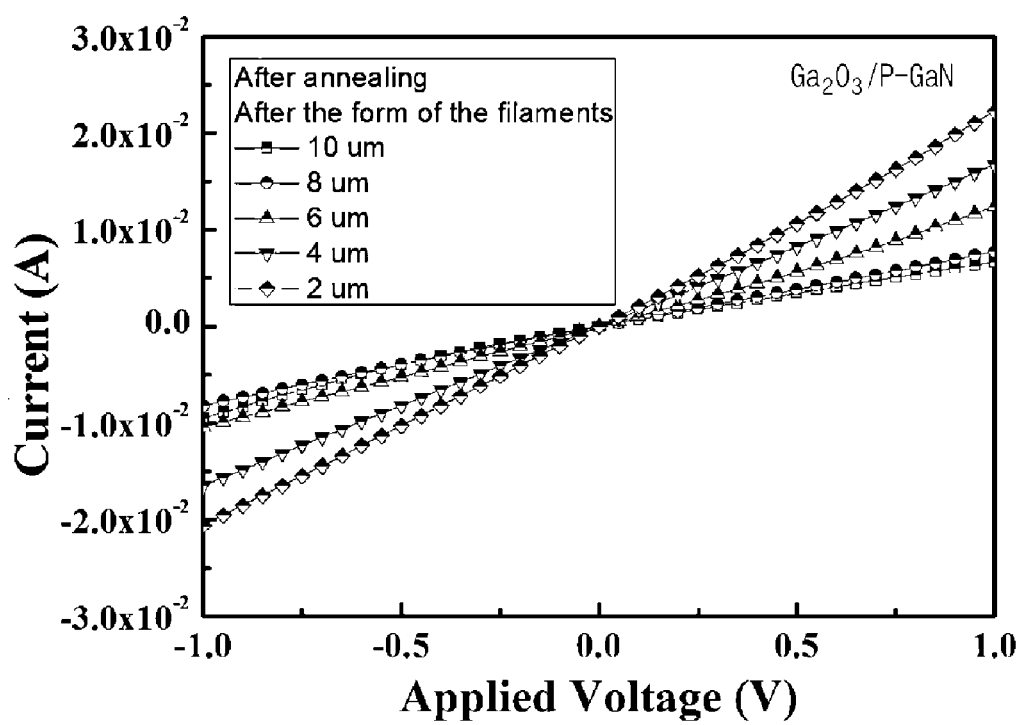
Figure 10E:
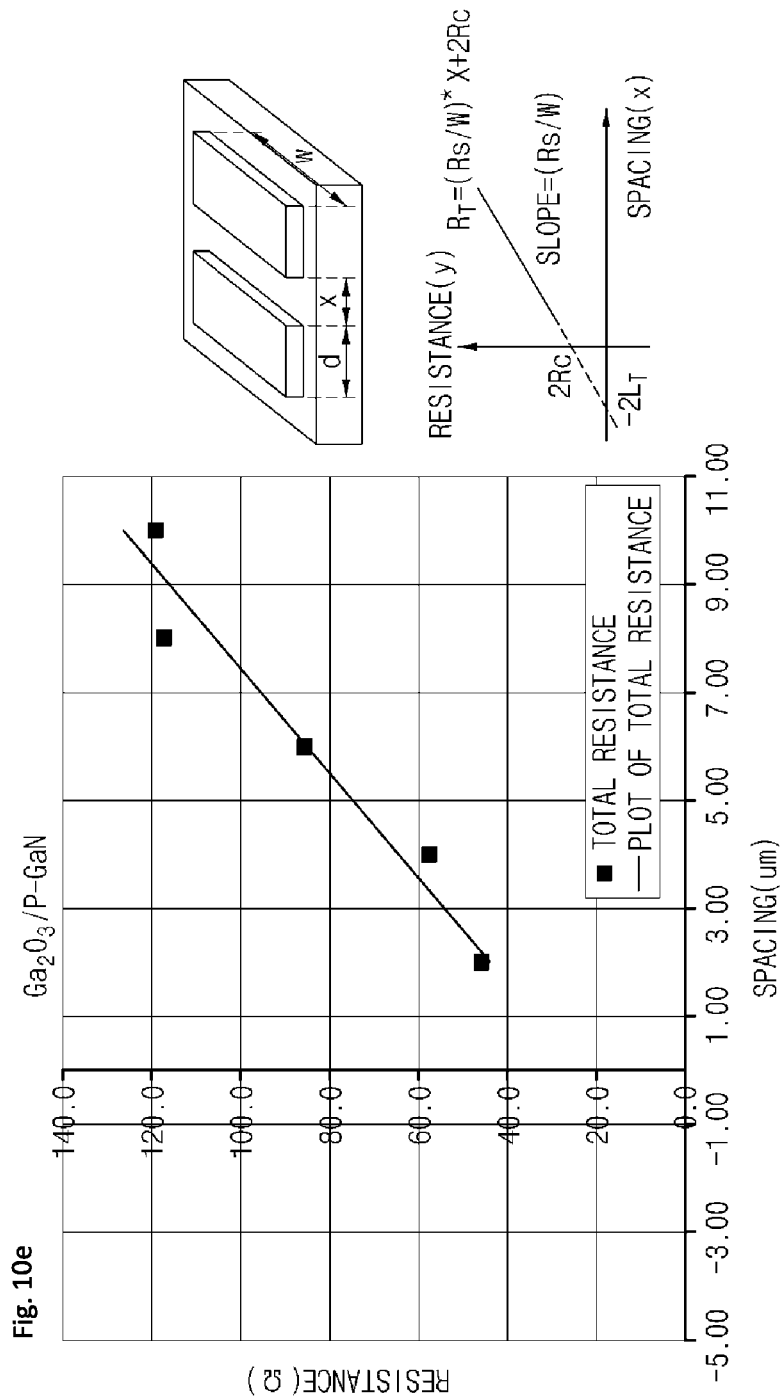

On the contrary, referring to FIG. 10d, it can be understood that, in the case where the distance between measurement electrodes is 2 μm, after the forming process, when the voltage applied to the transparent electrode is in a range of 0 V to 1.0 V, the current flowing into the transparent electrode is about 0 A to $2.0 \times 10^{-2}$ A, which is $10^9$ times the current flowing before the forming process. Accordingly, it can be understood that the ohmic characteristic is good so that the current is proportional to the voltage. In addition, referring to FIG. 10e, it can be understood that the ohmic contact resistance characteristic has linearity, and thus, the ohmic contact resistance characteristic is relatively improved in comparison to the ohmic contact resistance characteristic before the forming process.

The characteristics of the $Ga_2O_3$ transparent electrode formed on the p-GaN semiconductor layer in the example illustrated in FIGS. 7a to 7e are summarized as follows. The $Ga_2O_3$ transparent electrode has transmittance of 80% or more with respect to the light in a UV wavelength range of 264 nm or more. In addition, as a result of the measurement of the contact resistance by using the TLM pattern, the contact resistance before the forming process is 51,680 $\Omega cm^{-2}$, and the contact resistance after the forming process is $2.64 \times 10^{-5}$ $\Omega cm^{-2}$. Therefore, the conductivity of the transparent electrode is greatly improved, and the ohmic characteristic thereof is good.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A light emitting device comprising:
   a substrate;
   a first semiconductor layer which is formed on the substrate;
   an activation layer which is formed on the first semiconductor layer to generate light;
   a second semiconductor layer which is formed on the activation layer; and
   a transparent electrode which is formed on the second semiconductor layer by using a transparent insulating material of which resistance state is changed from a high resistance state into a low resistance state according to an applied electric field,
   wherein the transparent electrode includes conducting filaments through which a current flows, and which are formed by performing a forming process on the transparent electrode by applying a threshold voltage or more inherent in a material of the transparent electrode.

2. The light emitting device according to claim 1, further comprising a reflective layer formed on the transparent electrode.

3. The light emitting device according to claim 2, wherein the substrate and a submount substrate are combined to each other so that the reflective layer is in contact with a first conductive pattern formed on the submount substrate and an electrode pad formed on an externally exposed portion of the first semiconductor layer is in contact with a second conductive pattern formed on the submount substrate through a bump.

4. The light emitting device according to claim 1, wherein the first semiconductor layer is formed with an n-AlGaN layer, and the second semiconductor layer is formed with a p-AlGaN layer or a p-AlGaN layer and a p-GaN thin film.

5. The light emitting device according to claim 1, wherein the transparent electrode is in ohmic contact with the second semiconductor layer.

6. The light emitting device according to claim 1, further comprising a current spreading layer which is formed with CNT (carbon nano tube) or graphene between the second semiconductor layer and the transparent electrode.

7. The light emitting device according to claim 1, further comprising a current spreading layer which is formed with CNT or graphene to be in contact with a surface of the transparent electrode opposite to a surface of the transparent electrode which is in contact with the second semiconductor layer.

8. A light emitting device comprising:
   a substrate;
   a reflective layer which is formed on the substrate;
   a transparent electrode which is formed on the reflective layer by using a transparent insulating material of which resistance state is changed from a high resistance state into a low resistance state according to an applied electric field;
   a second semiconductor layer which is formed on the transparent electrode;
   an activation layer which is formed on the second semiconductor layer to generate light; and a first semiconductor layer which is formed on the activation layer, wherein the transparent electrode includes conducting filaments through which a current flows, and which are formed by performing a forming process on the transparent electrode by applying a threshold voltage or more inherent in a material of the transparent electrode.

9. The light emitting device according to claim 8, wherein the first semiconductor layer is formed with an n-AlGaN layer, and the second semiconductor layer is formed with a p-AlGaN layer or a p-AlGaN layer and a p-GaN thin film.

10. The light emitting device according to claim 8, wherein the transparent electrode is in ohmic contact with the second semiconductor layer.

11. The light emitting device according to claim 8, further comprising a current spreading layer which is formed with CNT (carbon nano tube) or graphene between the second semiconductor layer and the transparent electrode.

12. The light emitting device according to claim 8, further comprising a current spreading layer which is formed with CNT or graphene to be in contact with a surface of the transparent electrode opposite to a surface of the transparent electrode which is in contact with the second semiconductor layer.

* * * * *